United States Patent
Su et al.

(10) Patent No.: US 6,521,485 B2
(45) Date of Patent: Feb. 18, 2003

(54) METHOD FOR MANUFACTURING WAFER LEVEL CHIP SIZE PACKAGE

(75) Inventors: Spencer Su, Kaohsiung (TW); James Lai, Kaohsiung (TW); Lin Chien-Tsun, Kaohsiung (TW); Captain Chen, Tainan (TW); Allen Chen, Kaohsiung (TW); C.S. Yang, Kaohsiung (TW); Chang Chao-Chia, Kaohsiung (TW); Kevin Hsia, Kaohsiung (TW)

(73) Assignee: Walsin Advanced Electronics LTD, Kaohsiung (TW)

( * ) Notice: Subject to any disclaimer, the term of this patent is extended or adjusted under 35 U.S.C. 154(b) by 46 days.

(21) Appl. No.: 09/760,763

(22) Filed: Jan. 17, 2001

(65) Prior Publication Data

US 2002/0094601 A1 Jul. 18, 2002

(51) Int. Cl.[7] .......................... H01L 21/44; H01L 21/48; H01L 21/50
(52) U.S. Cl. .................. 438/114; 438/118; 438/465
(58) Field of Search .......................... 438/114, 118, 438/121, 465, FOR 387

(56) References Cited

U.S. PATENT DOCUMENTS

| 4,052,787 A | * 10/1977 | Shaheen et al. ............ 205/125 |
| 5,411,918 A | * 5/1995 | Keible et al. ................ 257/737 |
| 5,742,094 A | * 4/1998 | Ting ............................ 257/620 |
| 6,022,758 A | 2/2000 | Badehi ........................ 438/108 |
| 6,153,448 A | * 11/2000 | Takahashi et al. .......... 257/737 |
| 6,309,912 B1 | * 10/2001 | Chiou et al. ................ 438/107 |
| 6,316,289 B1 | * 11/2001 | Chung ........................ 438/118 |
| 6,333,469 B1 | * 12/2001 | Inoue et al. ................ 174/260 |

FOREIGN PATENT DOCUMENTS

EP 0844665 A2 5/1998

* cited by examiner

*Primary Examiner*—Wael Fahmy
*Assistant Examiner*—Michelle Estrada
(74) *Attorney, Agent, or Firm*—Troxell Law Office PLLC (57) ABSTRACT

A method for manufacturing a wafer level chip size package and the method comprises the steps of: securing wafer to a partly etched lead frame, drilling blind hole and filling conductive material after packaging the lead frame to electrically connect the lead frame and the wafer, thus providing inner electrical connection of the wafer after packaging.

6 Claims, 7 Drawing Sheets

METHOD FOR MANUFACTURING WAFER LEVEL CHIP SIZE PACKAGE

BACKGROUND OF THE INVENTION

1. Field of the Invention

The present invention relates to a method for manufacturing a wafer level chip size package (WLCSP) and, in particular, to a method for manufacturing a wafer level chip size package having lead frame with redistribution lead fingers and using drilling and filling, instead of wire bonding or bumps, for inner electrical connection.

2. Description of the Prior Art

Packages in the same size of, or slightly larger than the chips they pack are always called chip size package, CSP. The size of the package is not larger than 1.2 times of size of the chip and meets the recent demand of electronic component being thin and small. Comparing to both bare chip and flip chip, chip size package has better protection to resist dust and humidity.

To simplify manufacturing process of chip size package, a wafer package is claimed in EP patent No.0844665. A lead frame is used as interposer of the chip size package and process of packaging proceeds directly on a wafer having a plurality of chips. For the out conneceters of lead frame can only being formed on the perimeter of the chip, therefore, there is no way this method can pack wafer having multi-electrodes. And, for using bonding wire as inner connector between lead frame and chip by wire bonding, wire bonding machine in the back process has to be moved to wafer process on the pre process, and that is not proper for process integration.

A well-known method for wafer level package in accordance with U.S. Pat. No. 6,022,738 discloses a technique to drill blind hole on the isolative package body of the pre-sealed wafer, and provide metal coating traversing the package body for plating solder bumps. The drawback is that the wafer has to place redistribution circuits and place the connecting pads in a proper position, so that the method for wafer package cannot be applied in a wafer having different distribution of connecting pads.

SUMMARY OF THE INVENTION

Therefore, the first object of present invention is to provide a method for manufacturing the wafer level chip size package which package on the wafer directly, in particular, directly package on wafer having different type of connecting pads distribution or multi-electrodes.

The second object of present invention is to provide a method for manufacturing the wafer level chip size package, which selectively etch the first layer of a metal plate to form the redistribution conductive circuits, drill blind holes after securing metal and wafer, and electrically connect connecting pads of wafer and conductive circuits of metal plate by filling conductive material into blind holes, thus chip size packages having multi-electrodes can be produced.

The third object of present invention is to provide a chip size package, wherein, the redistribution conductive circuits of the chip size package having the first ends and the second ends, wherein, the first ends being at vertical position with connecting pads of chip, and acting as inner electrical connection of the package structure to replace bumps or bonding wire by drilling and traversing the first ends after encapsulating.

The forth object of present invention is to provide a method to grow bumps on wafer, wherein proceed packaging wafer with metal plate (lead frame) and redistribute out connecting points simultaneously, thus can package wafer having different connecting pads and eliminate process of redistribution in wafer.

According to the method for manufacturing a wafer level chip size package, the steps of the method comprises:

providing a wafer having a plurality of chips, each chip having a plurality of connecting pads on its active surface;

providing a metal plate consisting of the first layer and the second layer, wherein, a plurality of conductive circuits being formed by selectively etching the first layer of the metal plate, the plurality of conductive circuits being fixed on the second layer of the metal plate, and individual conductive circuit having at least the first end and the second end, and the first ends corresponding to the distribution of connecting pads of chips in the wafer;

securing active surface of the wafer to the first layer of the metal plate, when the wafer and the metal plate being secured, connecting pads of the chips and the first ends of the conductive circuits being in vertical position to each other;

drilling blind holes on the plurality of first ends, wherein the blind holes traversing through metal plate and expose connecting pads of the wafer;

filling conductive material on the plurality of blind holes until the connecting pads of chip and the first ends of the conductive circuits becoming electrical connection;

removing the second layer of the metal plate;

planting solder balls on the second ends of the conductive circuits; and dicing the packed wafer and resulting in a plurality of chip size packages.

DETAILED DESCRIPTION OF THE PREFERRED EMBODIMENT

Referring now to the drawings, the chip size packages according to the individual embodiments of the present invention will be described.

The method for manufacturing process of a wafer level chip size package according to the embodiment of the present invention comprises the following steps.

Figure 1:
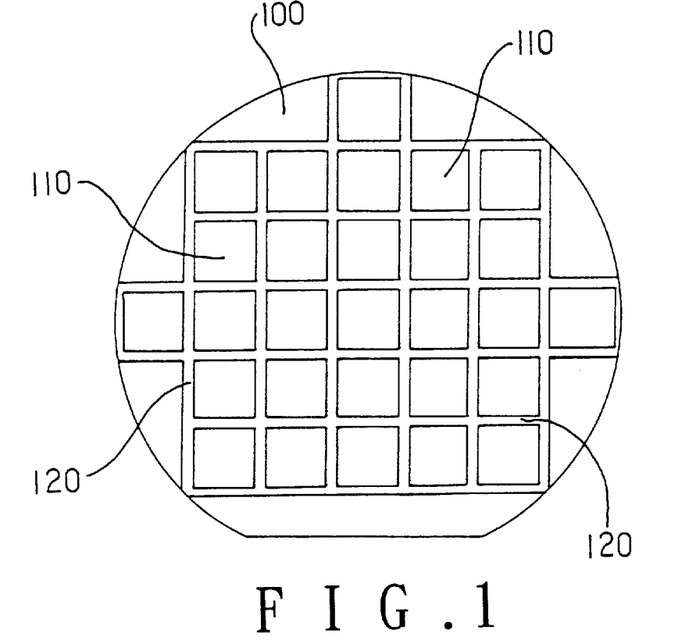
FIG. 1 is a perspective view showing a well-known wafer.
Figure 2:
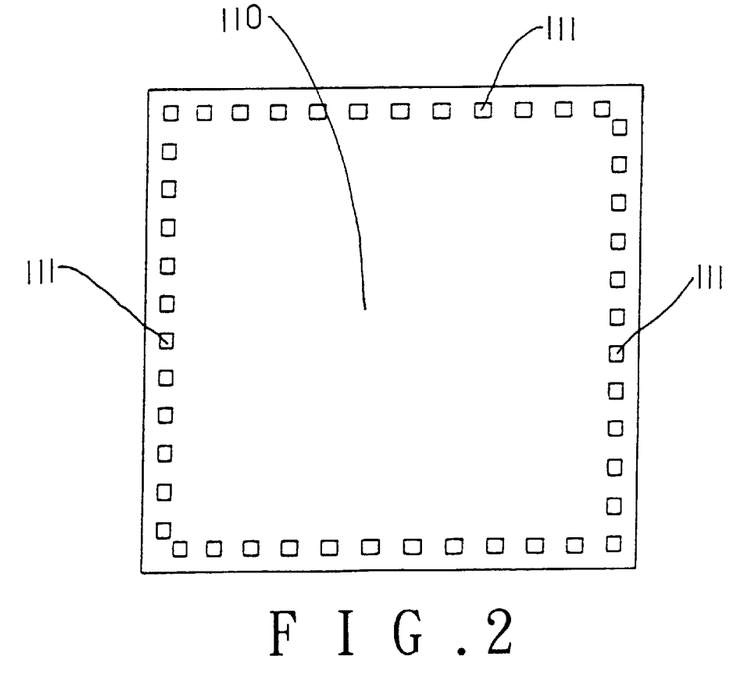
FIG. 2 is a perspective view showing distribution of connecting pads of a chip in a wafer.

As shown in FIG. 1, in step of providing a wafer 100, wherein, the wafer 100 generally is sliced from monosilicon crystal ingot or polysilicon crystal ingot and then integrated circuit layout is formed on its surface. The wafer 100 comprises a plurality of chips 110 and dice area 120 is reserved between chips 1 10 for cutting the wafer 100 into a plurality of individual chips 110 after forming integrated circuits. As shown in FIG. 2, each chip has a plurality of connecting pads 111 on the active surface of the wafer 100 as its outer connectors. In this embodiment, a chip 110 has generally distributed connecting pads 111. Connecting pads 111 are near perimeter of active surface of the chip 110, arranged closely to each other, used for the well-known method of wire-bonding and securing to the adjacent lead fingers or substrate. Generally speaking, pitch between connecting pads 111 of the chip 110 is very tiny (about 40 to 100 μm) and it is not suitable to form bumps on the connecting pads for flip chip securing to the circuit board directly.

Figure 3:
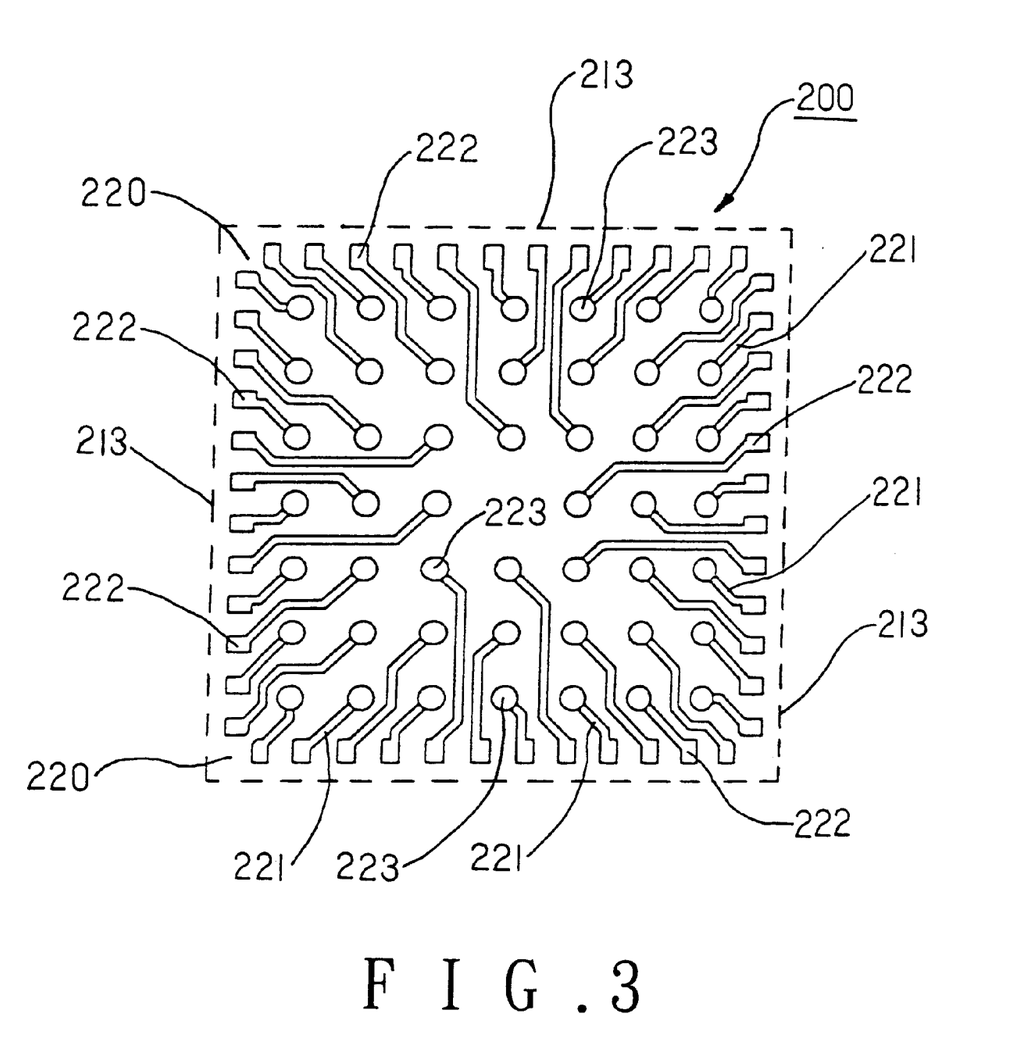
FIG. 3 is a perspective view showing a lead frame of the metal plate corresponding to a chip according to the present invention.

FIG. 3. shows step of providing a metal plate 200 as lead frame for the wafer 100. It is better that selecting an alloy that its coefficient expansion is near to the wafer 100 for the metal plate 200. Wherein, the metal plate 200 consists of the first layer 211 and the second layer 212 (referring to FIG. 4). To strengthen adherence with adhesive 300, the first layer 211 of metal plate 200 better has a rough surface. There is an area 213 on the metal plate 200 corresponding to the said plurality of chips 110 of wafer 100, wherein, in a corresponding area 213, the first layer 211 of metal plate 200 is used as lead frame 220 of chip size package of the chip 110.

Figure 4:
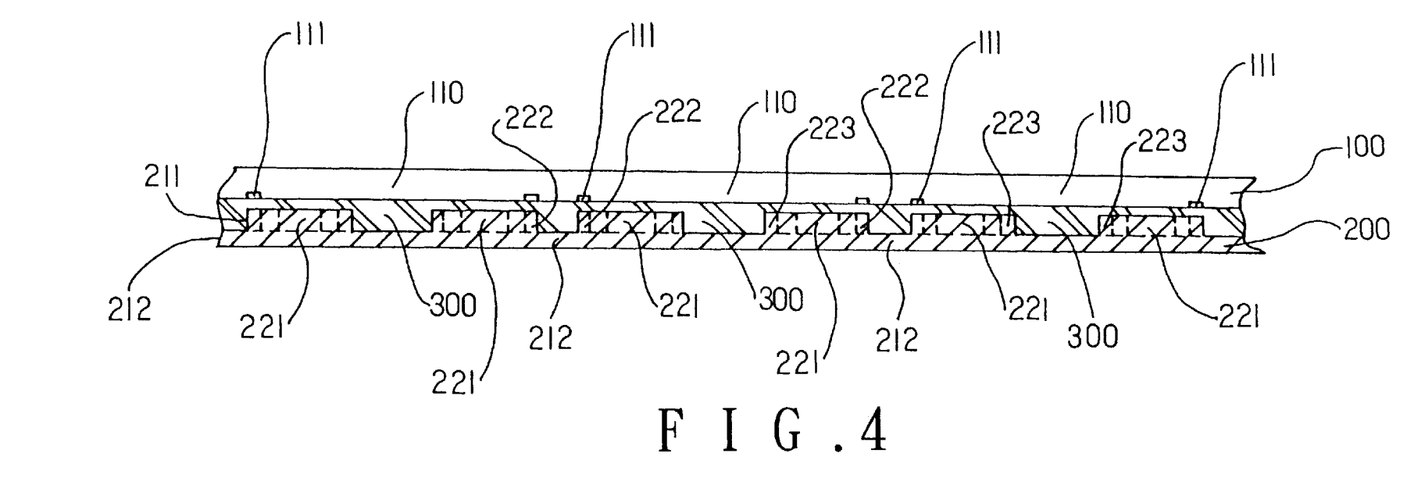
FIG. 4 is a cross-sectional view showing the secured structure of wafer and metal plate according to the present invention.

Then, shown in FIG. 3 and 4 is step of selectively etching the first layer 211 of the metal plate 200 to form a plurality of redistribution conductive circuits 221 (or lead fingers). The second layer 212 of the metal plate 200 supports the plurality of redistribution conductive circuits 221. That is, the plurality of redistribution conductive circuits 221 protrudes from and also supported by the second layer 212 of the metal plate 200. Etch the first layer 211 of the metal plate 200 and leave only conductive circuits 123. Since the plurality conductive circuits 221 are supported by and shaped in one with the second layer 212 of the metal plate 200, there will be no circumstance of shifting or falling off, and far more stable than using surrounding dam bar to connect and fix lead fingers of well-known lead frame. The conductive circuits 221 are of different length and in any demanded curve shape. Using well-known technique, such as using a mask to cover path for the conductive circuits 221 of the first layer 211 of the metal plate 200, and then proceed selectively etching, can form the conductive circuits 211. The plurality of conductive circuits 221 all has respective connected first end 222 and second end 223. The first ends 222 are corresponding to the connecting pads 111 of the chip 110 and near perimeter of the corresponding area 213 for inner electrical connection with the connecting pads 111 of the chip 110. The meaning of "redistribution" is that the second ends 223 distribute over the corresponding area 213 to provide outer electrical connection of chip size package and the minimum distance between a plurality of the second ends 223 is longer than the minimum distance between a plurality of the first ends 222 (referring to FIG. 3). For adjacent second ends 223 distributing more dispersedly and evenly than adjacent first ends 222 doing, outer electrical connection of the chip 110 leans on the second ends 223 of the conductive circuits 221 to redistribute its layout. Besides, the conductive circuits 221 can also be seen as lead fingers of lead frame of chip size package.

FIG. 4 shows securing active surface (surface having connecting pads 111) of said wafer 100 to the first layer 211 of the metal plate 200 mechanically. When the wafer 100 and the metal plate 200 being secured, connecting pads 111 in chip 110 and the first ends 222 of conductive circuits 221 are corresponding to each other vertically. In this embodiment, when securing wafer 100 and metal plate 200 with insulating adhesive 300, normally there is a insulating material (filled by adhesive 300) left between the first ends 222 of metal plate 200 and connecting pads 111 of wafer 100, and that don't assure of electrically connecting both certainly, especially forming a insulating layer between wafer 100 and metal plate 200. Besides, the insulating material used as adhesive 300 for securing wafer 100 and the metal plate 200 is liquid epoxy compound or other adhering combination material, such as solid polyimide tape, film and substrate. If use liquid epoxy compounds as adhering material, a curing process is needed to solidify the adhesive 300. Particular things to know is that, in this step, the wafer 100 and the metal plate 200 are not electrically connected; further, adhesive 300 isolate the wafer 100 and the metal plate 200.

Figure 5:
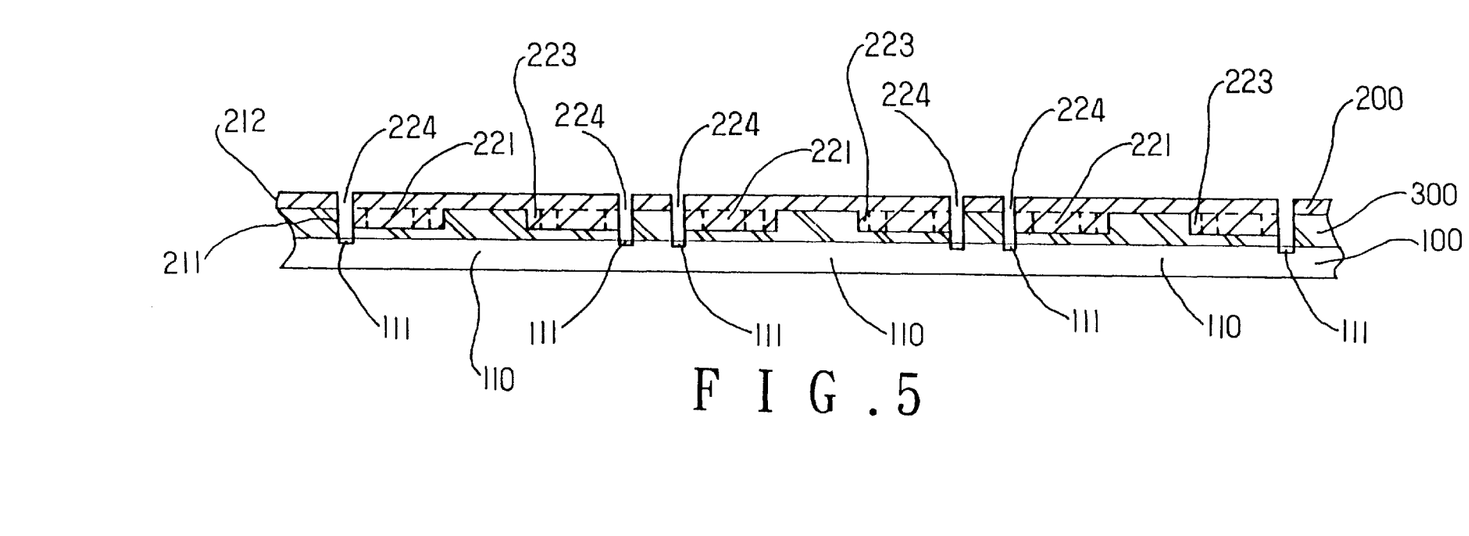
FIG. 5 is a cross-sectional view showing the secured structure after laser drill according to the present invention.

FIG. 5 shows laser drill blind holes 224 on a plurality of first ends 222. A method of controlled depth drilling is used to process this step. Wherein, depth of a blind hole 224 is enough to traverse metal plate 200 and adhesive 300, and then expose connecting pads 111 of chip 110. Diameter of blind hole 224 is better to be smaller than diameter of cross-sectional area of the first end 222. That is, the blind hole 224 is formed inside the first end 222 to increase electrical connection area between conductive circuit 221 and connecting pad 111.

Figure 6:
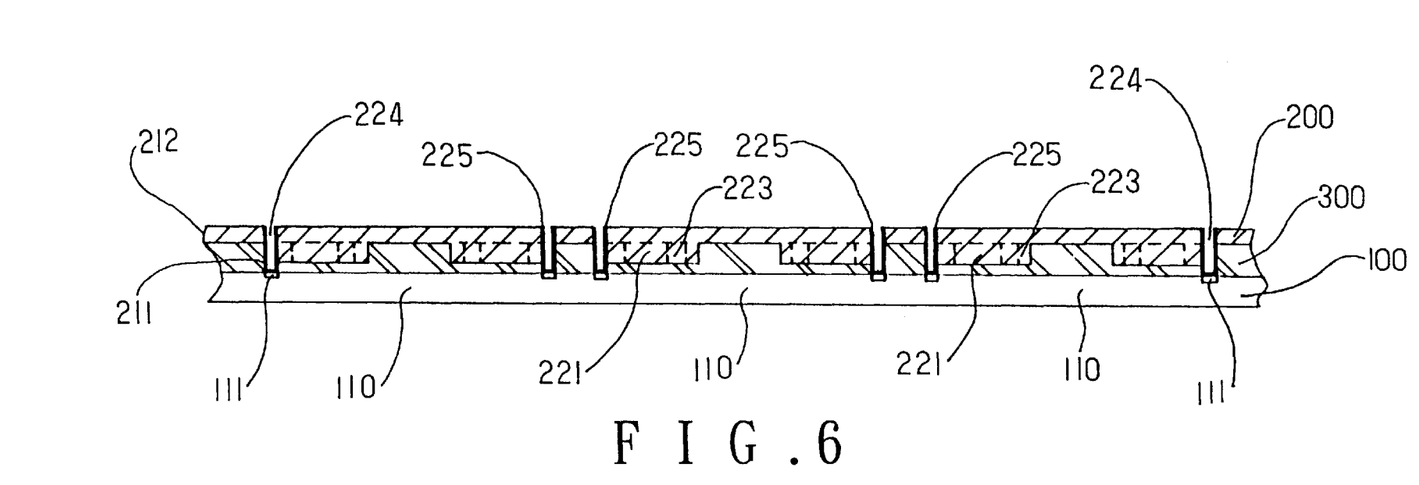
FIG. 6 is a cross-sectional view showing the secured structure after coating according to the first embodiment of present invention.
Figure 7:
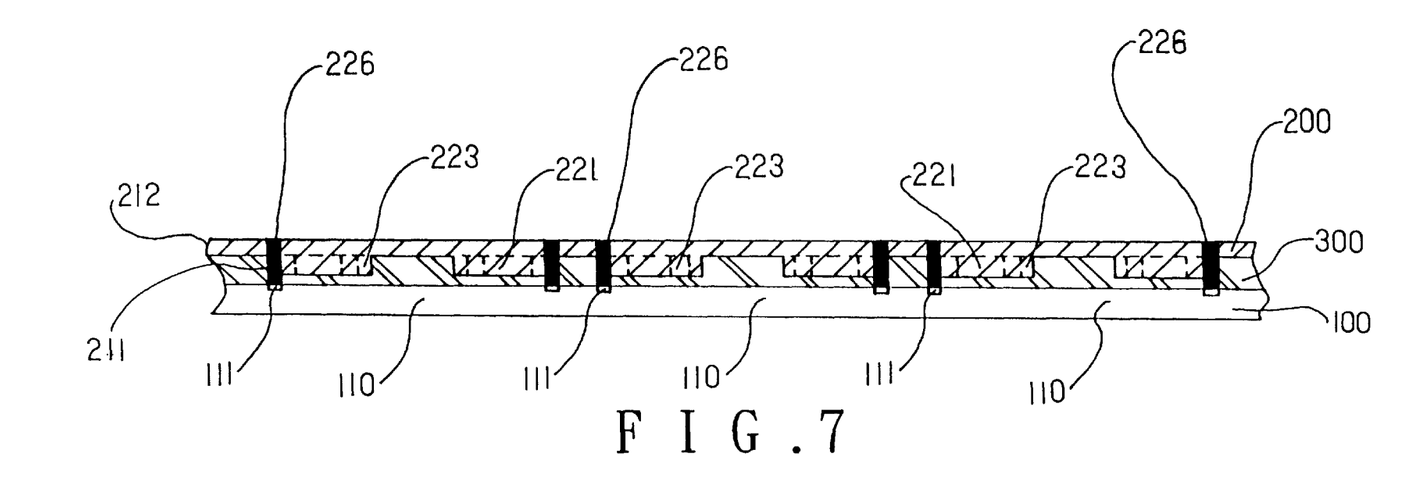
FIG. 7 is a cross-sectional view showing the secured structure after filling conductive material according to the present invention.

FIG. 6 shows coating metal foil 225 on said blind holes 224. Generally, the methods are to electroplate nickel, copper, or to deposit metal film during PVD (Physical Vapor Deposition) or CVD (Chemical Vapor Deposition) process of wafer manufacturing, or method similar to UBM (Under Bump Metallization) manufacturing. Then, as shown in FIG. 7, filling conductive paste 226 to blind holes 224 for electrical connection of connecting pads 111 of chips 110 in the wafer 100 and conductive circuits 221, wherein, the conductive paste 226 is solder paste containing lead or tin, or resin or conductive plastic conductive epoxy, or a nickel and copper compound. The step of coating metal foil according to the present invention has ability of strengthen electrical connection, but not a necessary step.

Figure 8:
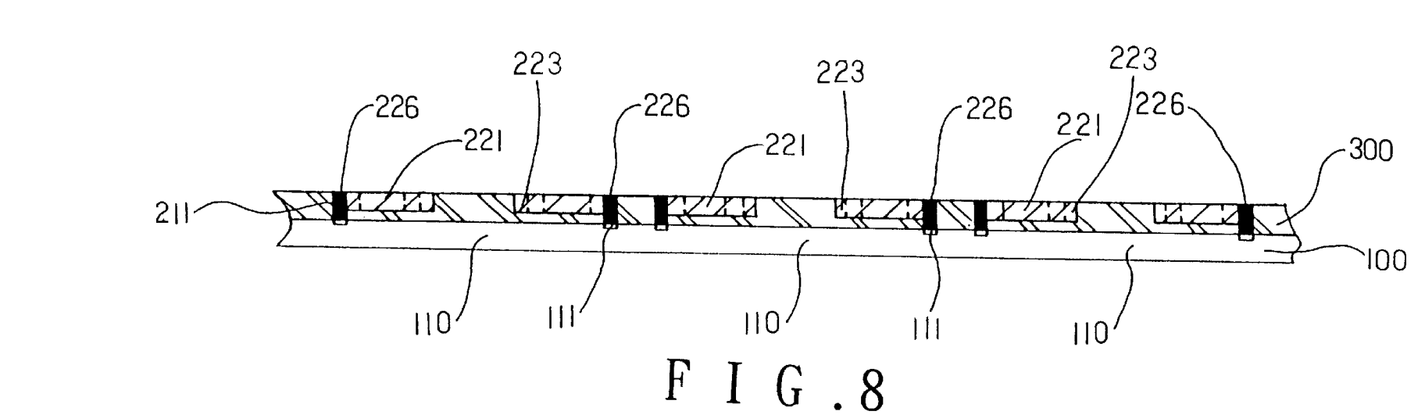
FIG. 8 is a cross-sectional view showing the secured structure after grinding according to the first embodiment of present invention.

After electrically connecting the connecting pads 111 and the conductive circuits 221, FIG. 8 shows removing the second layer 212 of the metal late 200. Generally, method of grinding is used to remove the second layer 212 until expose the first layer 211 of conductive circuit 221, and isolate different conductive circuits 221 not to short electrical connection. In this time, conductive circuits 221 is fixed by adhesive 300.

Figure 9:
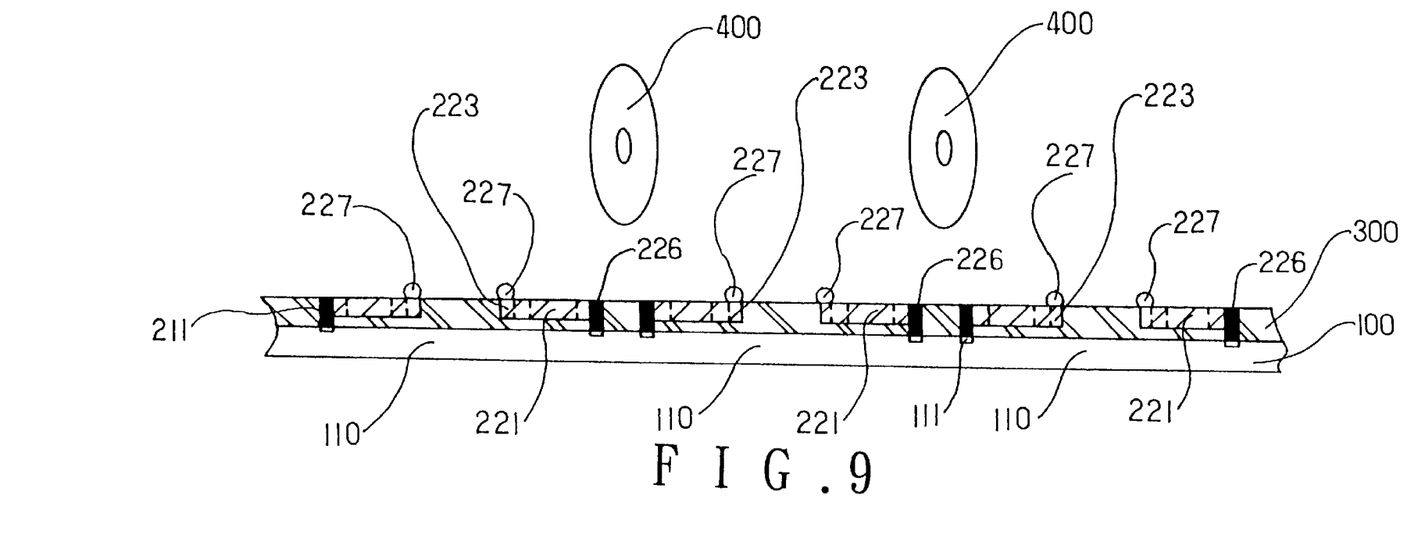
FIG. 9 is a cross-sectional view showing the secured structure after plating solder ball according to the present invention.
Figure 10:
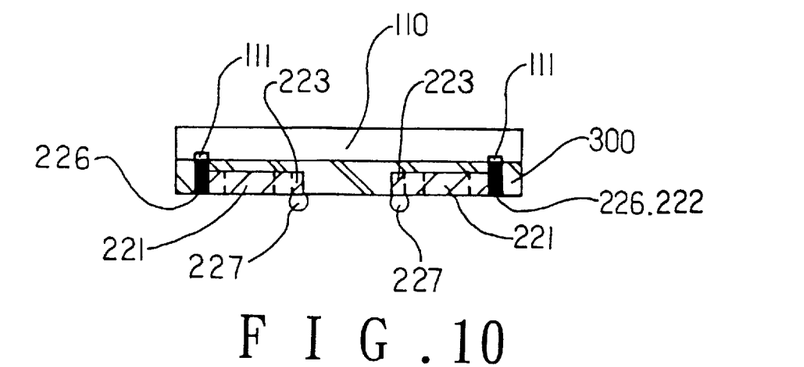
FIG. 10 is a cross-sectional view showing one of chip size packages after dicing according to the present invention.

FIG. 9 shows plating solder balls 227 or solder bumpers on the second ends 223 of conductive circuits 221. Currently, well-known methods to form solder balls or solder bumps is evaporation, electroplating or printing. After producing a packed wafer, use dicing facility 400 to dice along dice area 120 and result in a plurality of chip size packages as shown in FIG. 10. Or, eliminate step of planting solder balls 277 and skip to step of dicing, then result in chip size packages secured by solder paste without solder balls.

Therefore, the method for manufacturing wafer level chip size package according to the present invention is possessed of the following benefits. 1) Providing a method for packaging on wafer directly will reduce more manufacturing cost than packaging on chip. 2) Instead of using well-known solder bump and wire-bonding as technical way of inner electrical connection before package, electrically connecting lead frame (conductive circuits 221) and chip 110 after laser controlled depth drilling 224 will change the interconnection process after package by plating, CVD, PVD or filling. 3) Using redistribution conductive circuits 221 as redistribution point of out electrical connection for connecting pads 111 of wafer 100 will increase distance between out connection points (the second ends 223), reduce fail during surface mounting, and can be used in wafer level package having multi I/O ends.

Figure 13:
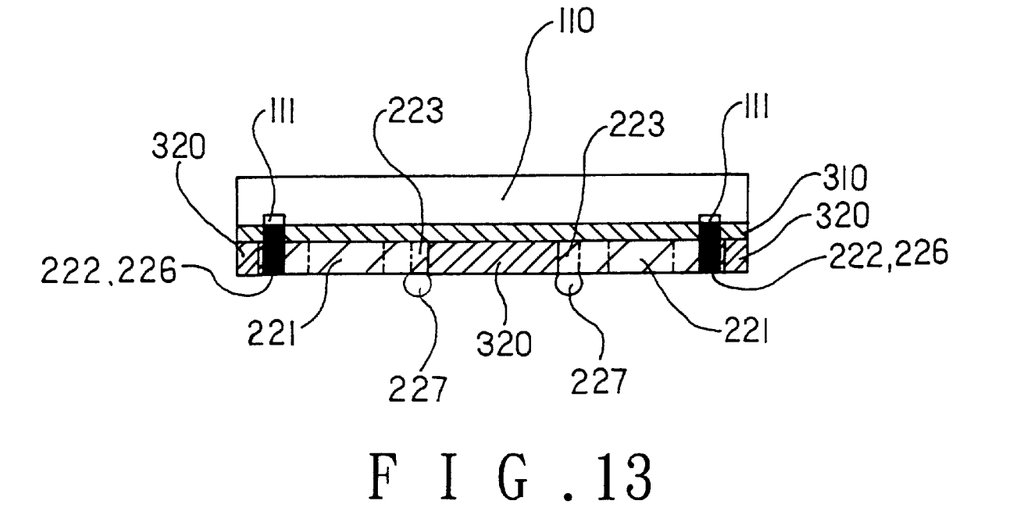
FIG. 13 is a cross-sectional view showing another chip size package according to the present invention.

Meanwhile, a chip size package which is provided according to present invention, as shown in FIG. 10, comprises: a chip 110 having a plurality of connecting pads 111 formed on its active surface, and the chip 110 being upside-down secured to a lead frame in flip chip type without growing solder bumps (i.e. bare chip); a lead frame consisting of a plurality of lead fingers 221, wherein, each lead finger 221 comprising at least the first end 222 and the second end 223, wherein the first ends 222 corresponding to a plurality of connecting pads 111 of chip 110, and the second ends 223 connected with solder balls 227 as out connection of the connecting pads 111; and an isolative material (package body) in between lead frame and chip 110, such as adhesive 300 which is used to secure chip 110 and lead frame (lead fingers 221) as described in manufacturing method. For the isolative material, If use liquid epoxy compound as package body, than at least fill in between active surface of chip 110 and lead frame, and at least expose the second ends 223 of the lead frame and a surface of the first ends 222 (shown in FIG. 10). Otherwise, as shown in FIG. 13, if use insulation tape 310 as isolative material in between chip 110 and lead frame (lead fingers 221), than fill in only small quantity of liquid epoxy compound between lead fingers 221. When lead frame and chip 110 is secured by adhesive 300, the first ends 220 correspond to connecting pads 111 of chip 110 vertically, and the exposed surface of the first end 220 is formed from drilling blind holes, exposing connecting pads 111, then, filling in conductive material 226, so that the first ends 222 is electrically connected to the connecting pads 111 at vertical position. Therefore, the method for chip size package according to the present invention is mainly to proceed inner electrical connecting after packaging. Steps to drill blind holes on the metal plate, fill conductive material into blink holes, and electrically connect between lead fingers 221 and chip 110 replace using bumps and bonding wire as inner electrical connection of a chip during the packaging. Proper distribution of the lead fingers 221 makes the minimum distance of plurality of second ends 223 being longer than the minimum distance of the plurality of first ends 222, and reaching the requirement of redistribution.

Figure 11:
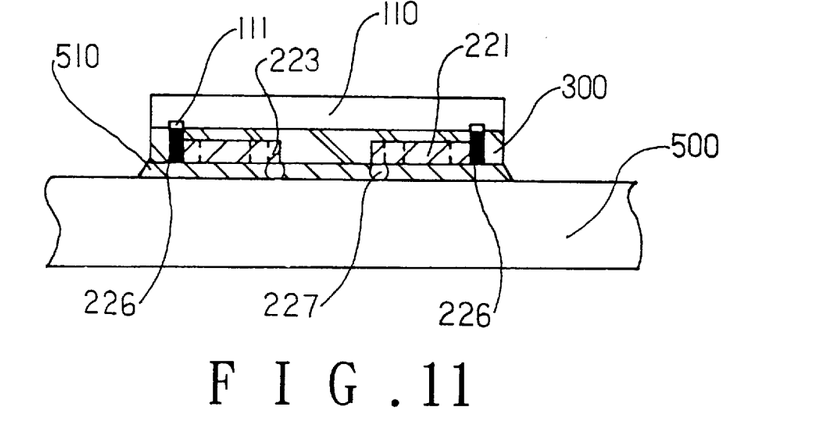
FIG. 11 is a cross-sectional view showing one of chip size packages secured to circuit board according to the present invention.
Figure 12:
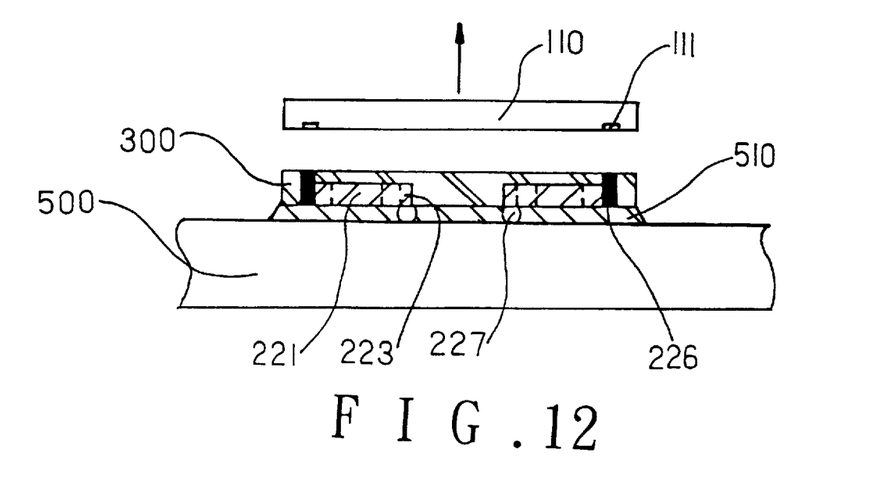
FIG. 12 is a cross-sectional view showing one of chip size package secured to circuit board having ability of peeling off according to the present invention.

Secure said chip size package structure to circuit board 500 as shown in FIG. 11. Provide a underfill 510 in between chip size package structure and circuit board 500, wherein, the underfill 510 is made from thermosetting liquid epoxy compound. During re-flowing, uses solder balls to electrically connect between the second ends 223 of the package structure and circuit board 500, and solidify underfill simultaneously. For inner electrical connection of the chip size package producing by drilling blind holes and filling conductive material 226 into the blind holes, chip 110 in the chip size package structure has the ability of peeling off. FIG. 12 shows a chip 110 can be peeled off and re-packaged no matter because of the chip 110 being secured to a bad package structure (lead frame) or the chip size package structure being secured to a bad circuit board.

Besides, the method for wafer level chip size package according to present invention also provides a process for growing bumps on a wafer 100 in a packaged structure, wherein the bump is made from tin compound or gold similar to said solder balls 227 of wafer level chip size package. The pocess has the benefits of 1) proper protection to wafer, 2) packaging wafer of different distribution of connecting pads redistribution and proceeding redistribution of outer connection.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing wafer level chip size package at least comprising the steps of:

providing a wafer having a plurality of chips, each chip having a plurality of connecting pads on its active surface;

providing a metal plate consisting of a first layer and a second layer, wherein a plurality of conductive circuits are formed on the first layer of the metal plate by selectively etching, the plurality of conductive circuits are fixed on the second layer of the metal plate, and each conductive circuit has at least a first end and a second end, and the first ends of the conductive circuits are corresponding to the connecting pads of the chips in the wafer;

securing the active surfaces of the chips onto the first layer of the metal plate, when the wafer and the metal plate being secured, connecting pads of the chips and the first ends of the conductive circuits being in vertical position to each other;

drilling a plurality of blind holes on the plurality of first ends, wherein the blind holes pass through the metal plate and extend until exposing the connecting pads of the wafer;

filling conductive material on the plurality of blind holes until the connecting pads of chip and the first ends of the conductive circuits becoming electrical connection;

removing the second layer of the metal plate; and dicing the packed wafer to form a plurality of chip size packages.

2. The method for manufacturing a wafer level chip size package in accordance with claim 1, wherein, after the step of removing the second layer of the metal plate, further comprises:

planting solder balls on the second ends of the conductive circuits.

3. The method for manufacturing a wafer level chip size package in accordance with claim 1, wherein, before the step of filling conductive material, further comprises:

coating metal foil inside said blind holes.

4. The method for manufacturing a wafer level chip size package in accordance with claim 1, wherein in step of providing a metal plate, the surface of the first layer of metal plate is rough.

5. The method for manufacturing a wafer level chip size package in accordance with claim 1, wherein the minimum distance between a plurality of the second ends is longer than the minimum distance between a plurality of the first ends.

6. The method for manufacturing a wafer level chip size package in accordance with claim 1, wherein each blind hole has a smaller area on the corresponding first end than area of the first end.

* * * * *